(12) United States Patent
Marinas et al.

(10) Patent No.: US 8,604,890 B2
(45) Date of Patent: Dec. 10, 2013

(54) METHOD AND CIRCUIT FOR INCREASING THE RESOLUTION OF A DIGITALLY CONTROLLED OSCILLATOR

(75) Inventors: Alberto Marinas, El Puig (ES); Jose Ibanez Climent, Valencia (ES); Roberto Munoz, Limerick City (IE); Pedro Lopez Canova, Valencia (ES)

(73) Assignee: Analog Devices, Inc., Norwood, MA (US)

( * ) Notice: Subject to any disclaimer, the term of this patent is extended or adjusted under 35 U.S.C. 154(b) by 78 days.

(21) Appl. No.: 13/297,904

(22) Filed: Nov. 16, 2011

(65) Prior Publication Data

US 2013/0027149 A1 Jan. 31, 2013

Related U.S. Application Data

(60) Provisional application No. 61/513,313, filed on Jul. 29, 2011.

(51) Int. Cl.
*H03B 1/00* (2006.01)
*H03L 7/00* (2006.01)

(52) U.S. Cl.
USPC .......................... 331/177 R; 331/74; 331/34

(58) Field of Classification Search
CPC .... H03K 3/0231; H03L 7/24; H03L 2207/12; H03L 7/185; H03L 7/189; H03L 7/1972; H03L 7/1974
USPC ......... 332/109; 327/177; 331/178, 177 R, 34, 331/17, 16, 74, 78, 111, 143, 117 R
See application file for complete search history.

(56) References Cited

U.S. PATENT DOCUMENTS 7,791,428 B2 * 9/2010 Chang et al. .................... 331/16

* cited by examiner

*Primary Examiner* — Ryan Johnson
(74) *Attorney, Agent, or Firm* — Kenyon & Kenyon LLP

(57) ABSTRACT

A method and a circuit for increasing a resolution of a digitally controlled oscillator include controlling the oscillator so that an output signal of the oscillator varies between semi-periods having a first frequency and semi-periods having a second frequency. The method and circuit further include applying the output signal of the oscillator as an input to a divider to obtain a divided signal. A frequency of at least one semi-period of the divided signal is a function of both an oscillator semi-period having the first frequency and an oscillator semi-period having the second frequency.

22 Claims, 7 Drawing Sheets

| 2-LSB | Frequency Pattern |
|---|---|
| 00 | F1, F1, F1, F1 |
| 01 | F1, F1, F1, F2 |
| 10 | F1, F1, F2, F2 |
| 11 | F1, F2, F2, F2 |

Fig. 6

METHOD AND CIRCUIT FOR INCREASING THE RESOLUTION OF A DIGITALLY CONTROLLED OSCILLATOR

CROSS-REFERENCE TO RELATED APPLICATIONS

This application claims the benefit, under 35 U.S.C. §119 (e), of U.S. Provisional Patent Application No. 61/513,313, filed Jul. 29, 2011, the contents of which is hereby incorporated by reference in its entirety.

BACKGROUND INFORMATION

Digitally controlled oscillators generate a pulsed output signal having a selected frequency. The output signal is generated in response to a digital input, usually an N-bit code word. In some applications, an oscillator having a high frequency resolution is desirable. Frequency resolution refers to the minimum step size in a range of potential frequencies output by the oscillator. Smaller step sizes allow for a greater number of frequencies to be output within the same frequency range. Therefore, reducing step size (i.e., increasing resolution) means that a target output frequency can be specified with greater precision.

A conventional approach is to use a Direct Digital Synthesizer (DDS) solution in which a high frequency reference clock is used to obtain as output a lower frequency with a large resolution. The DDS solution has a disadvantage in that the frequency is only exact in average value, i.e., the frequency is prone to instantaneous variations and the output frequency is stable only when viewed as an average signal over time. When viewed at a low time scale, the generated output period has one reference period uncertainty for a pure digital DDS solution.

Another approach is using an oscillator whose frequency can be instantaneously changed by a digital word by means of a code-to-frequency conversion sub-circuit (such as a current or a voltage digital-to-analog converter (DAC) inside an oscillator core circuit). In this approach, increasing resolution means to increase the number of bits in the input signal to the oscillator and therefore in the code-to-frequency sub-circuit. The addition of these additional bits allows for a larger set of inputs (and therefore a larger set frequencies that can be expressed along the output range). However, increasing the number of input bits requires large amounts of physical space in an oscillator circuit due to the increase of the code-to-frequency sub-circuit (e.g., DAC). In many cases, each extra bit is accompanied by a two-fold increase in area. Therefore, the required area often exceeds space constraints.

SUMMARY

The method and circuit according to the present invention are based on a N-bit digitally controlled oscillator and it increases the resolution of the oscillator digitally, without adding any period time uncertainty of a DDS conventional approach and without increasing the size of an existing code-to-frequency N-bit element in the oscillator core. The method and circuit of the present invention only require that the N-bit controllable oscillator should be designed so that the frequency change given a code change is instantaneous (new coded frequency is accurate from the very first output period).

A method and a corresponding circuit according to example embodiments of the present invention include controlling an oscillator so that an output signal of the oscillator varies between semi-periods having a first frequency and semi-periods having a second frequency. The method and circuit also include applying the output signal of the oscillator as an input to a divider to obtain a divided signal. A frequency of at least one semi-period of the divided signal is a function of both an oscillator semi-period having the first frequency and an oscillator semi-period having the second frequency.

BRIEF DESCRIPTION OF THE DRAWINGS

FIG. 6 is a table showing various combinations of additional bits of resolution and exemplary frequency patterns that correspond to those combinations.

DETAILED DESCRIPTION OF EXAMPLE EMBODIMENTS

The present invention relates to a method and a circuit for increasing the resolution of a digitally controlled oscillator. Exemplary embodiments of the present invention are described with reference to a dual-slope oscillator that generates an output signal in response to a pair of ramped inputs. However, the present invention may also be implemented with other types of oscillators.

Figure 1:
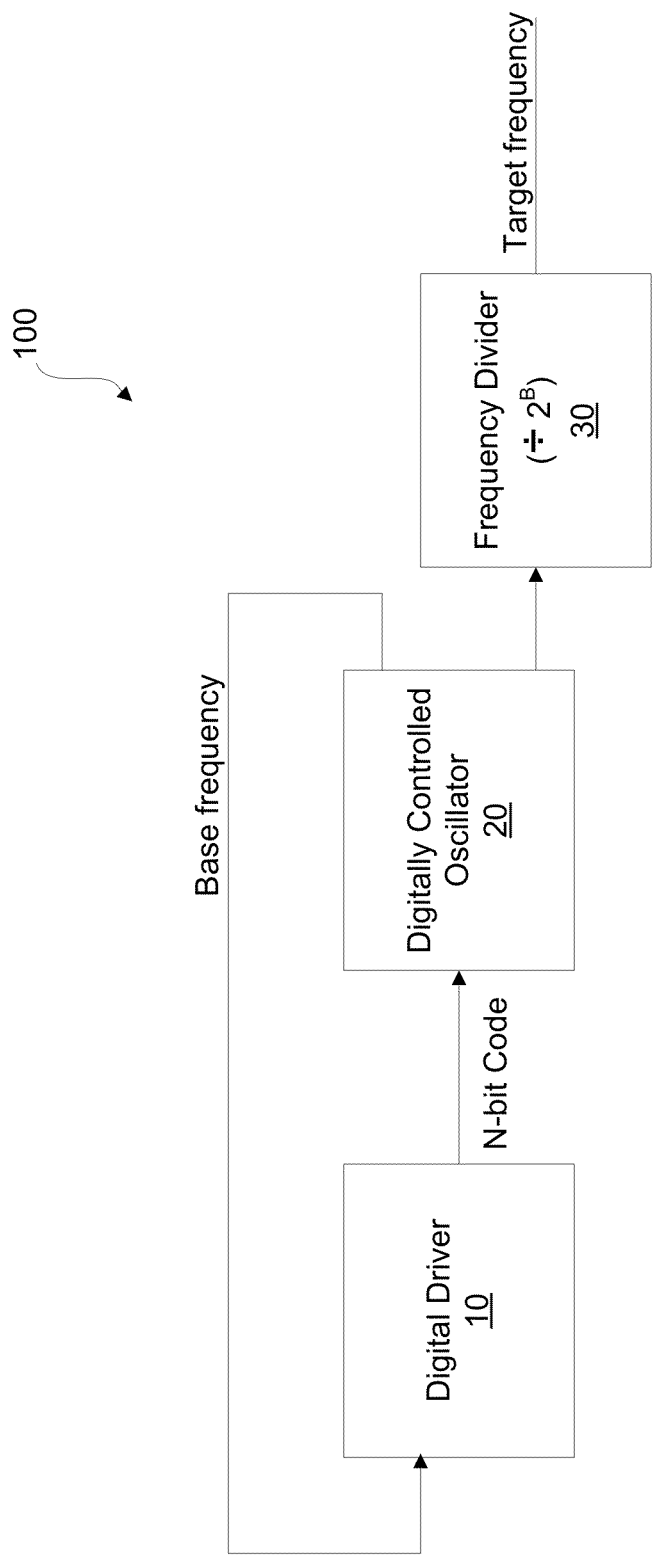
FIG. 1 is a block diagram of a circuit for increasing the resolution of a digitally controlled oscillator according to an example embodiment of the present invention.

FIG. 1 is a block diagram of a circuit 100 according to an exemplary embodiment of the present invention. The circuit 100 may include a digital driver 10, a digitally controlled oscillator 20 and a frequency divider 30. The driver 10 controls the oscillator 20 via an N-bit code, which is varied according to a predetermined sequence of codes. The driver 10 may determine the sequence of codes to apply based on a code mapping. For example, the driver 10 may be programmed to a specific target frequency and based on the target frequency, a sequence of codes required for generating the target frequency may be applied to the oscillator 20. The sequence may be stored in a memory of the digital driver, e.g., hard-wired or implemented in software as a lookup table.

The oscillator 20 may be any oscillator capable of instantaneously switching output frequencies in response to a change in an input signal, e.g., the N-bit code. It will be understood that what is meant by "instantaneous" is that the oscillator should settle into a new frequency quickly enough in response to a change in the code, that from the perspective of a load being driven by the system 100 (e.g., a clock input of an analog-to-digital converter), the frequency change occurs seamlessly, with minimal jitter, even at the first output period of the new frequency.

Figure 2:
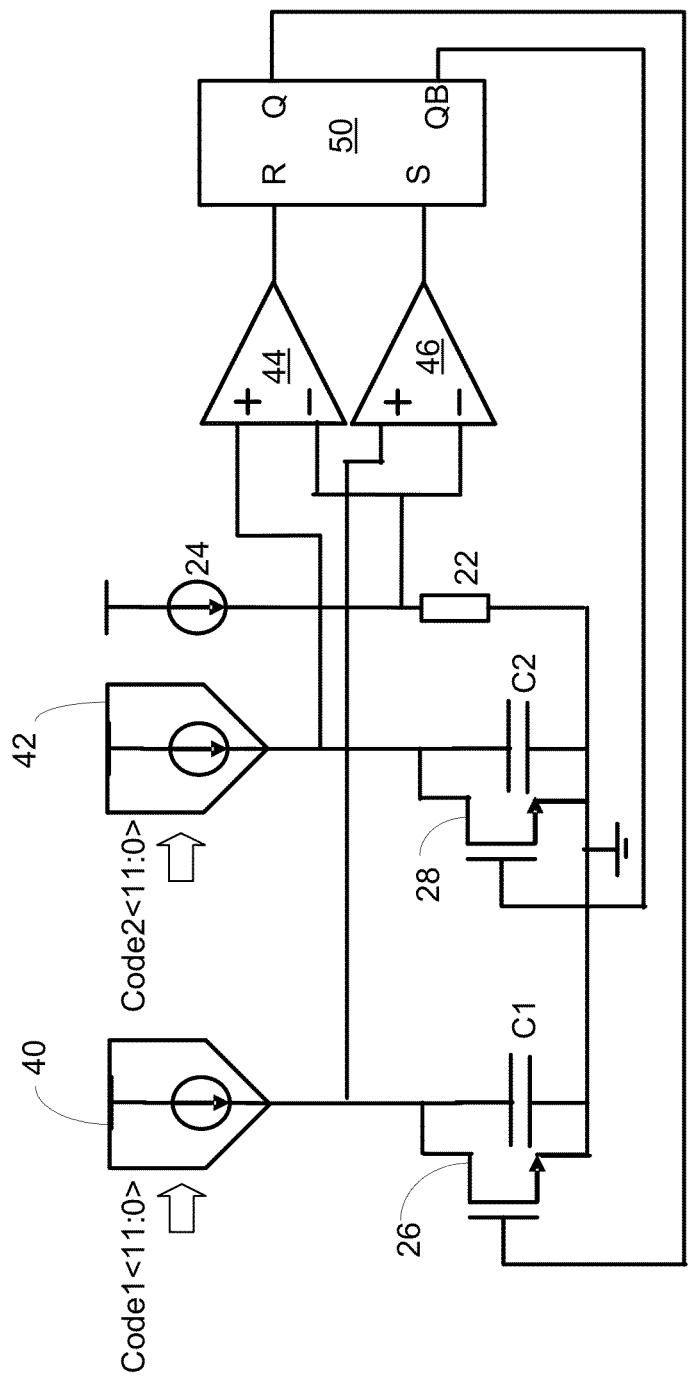
FIG. 2 is a schematic diagram of a conventional dual-slope oscillator.

FIG. 2 shows a conventional dual-slope oscillator, which may suitably be used as the oscillator 20 in FIG. 1. The dual-slope oscillator includes an arrangement for receiving a pair of current inputs (e.g., 12-bit code words: Code1 and Code2) via a corresponding pair of current digital-to-analog converters (IDACs) 40/42. The IDAC 40 receives Code1 and the IDAC 42 receives Code2. Each IDAC converts its code, which is a digital representation of a control current, into an analog current signal. Each analog current is then supplied to a non-inverting input of a respective comparator 44/46, to a drain terminal of a respective NMOS transistor 26/28, and to a respective capacitor C1/C2. Inverting inputs of the comparators 44/46 are connected to a first voltage (e.g., Vdd) via a current source 24, and connected to a second voltage (e.g., Vss) via a resistor 22. Source terminals of the transistors 26/28 are also connected to the second voltage.

The oscillator of FIG. 2 may also include an R-S latch 50, which receives an R input from the output of the comparator 44 and generates a Q output to a gate of the transistor 26. The latch 50 also receives an S input from the output of the comparator 46 and generates a QB output to a gate of the transistor 28. In operation, Code1/Code 2 are applied to set and reset the latch 50 in an alternating fashion. This occurs periodically in accordance with the charging and discharging of the capacitors C1/C2, thereby producing a pulsed signal (Q or QB), where the high clock semi-periods correspond to one code and the low clock semi-periods correspond to the other code. Typically, identical codes are applied as Code1/Code2 in order to generate a signal having a fixed frequency, i.e., the high clock semi-periods and the low clock semi-periods are of the same duration.

Returning to FIG. 1, the frequency divider 30 receives the pulsed signal from the oscillator (e.g., a base frequency signal) and generates a second pulsed signal (corresponding to the target frequency) by dividing the base frequency signal. In an example embodiment, the divider 30 may divide by a factor of $2^B$, where B is the number of extra bits of resolution in addition to the N-bits of resolution already provided by the oscillator 20. Thus, the target frequency signal output by the divider is at least twice as slow as the base frequency signal. Each division operation in the divider 30 may generate a pulse (semi-period) in a divided signal based on a plurality of corresponding pulses in the base frequency signal. For example, the divider 30 may include an edge-triggered counter that counts a certain number of base frequency semi-periods required for triggering each divided signal semi-period. The number of base frequency semi-periods per divided signal semi-period will vary depending on the division factor. For example, when dividing by four, the divider 30 may generate a divided signal semi-period based on a set of four consecutive base frequency semi-periods (two high clock semi-periods and two low clock semi-periods). As will be explained, by mixing different frequencies in the base frequency pulses, it is possible to obtain target frequencies (corresponding to the divided signal pulses) that are not obtainable using a uniform base frequency signal.

Figure 3:
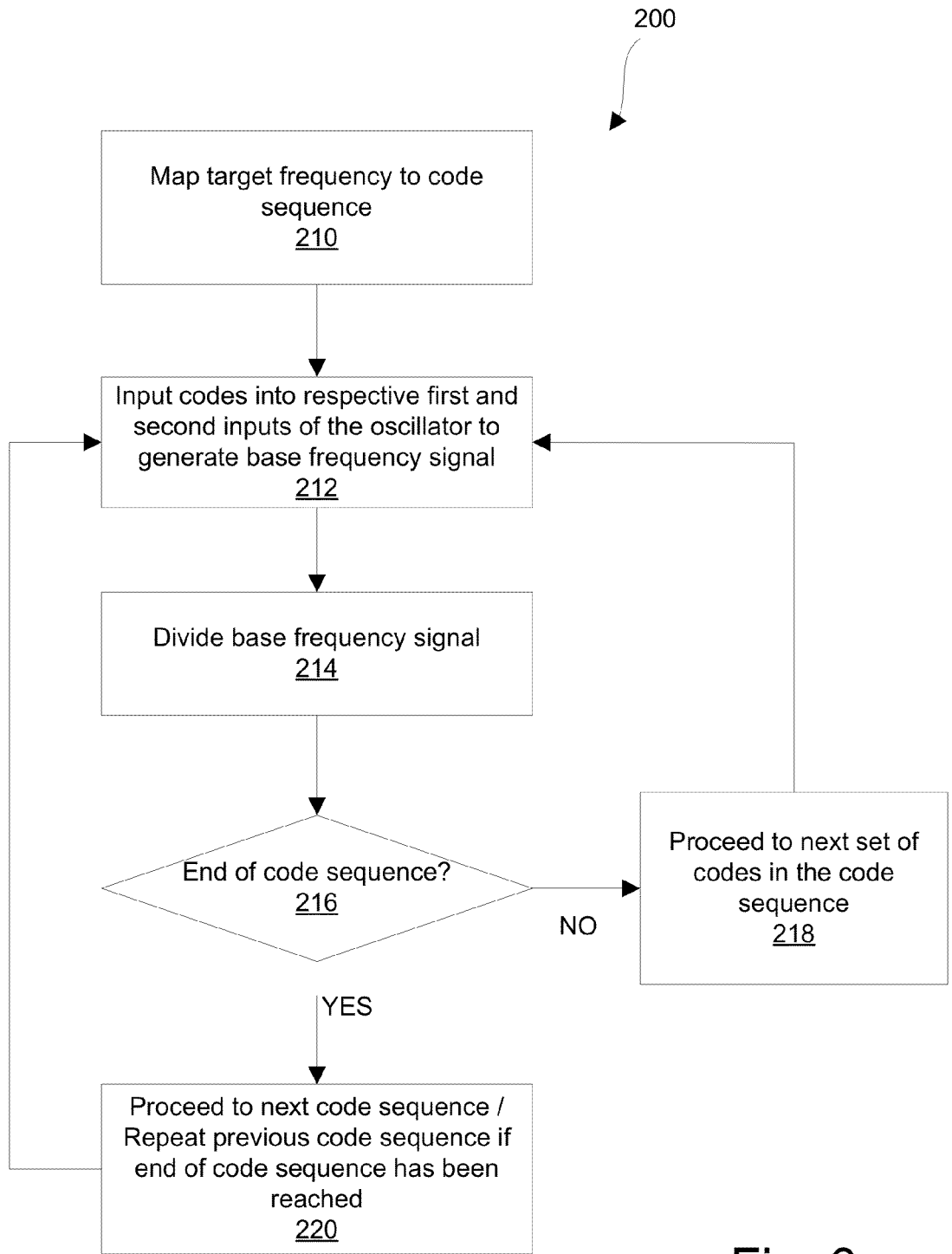
FIG. 3 is a flowchart of a method for increasing the resolution of a digitally controlled oscillator according to an example embodiment of the present invention.

FIG. 3 is a flowchart of a method 200 for increasing the resolution of a digitally controlled oscillator according to the present invention. The method 200 may be implemented with the circuit 100 and, particularly with the oscillator of FIG. 2. However, the method 200 may be applied to other oscillator circuits. In step 210, the driver 10 may map the target frequency to a code sequence that produces the target frequency at the output of the divider 30. The code sequence will now be explained in connection with FIGS. 4 and 5.

Figure 4:
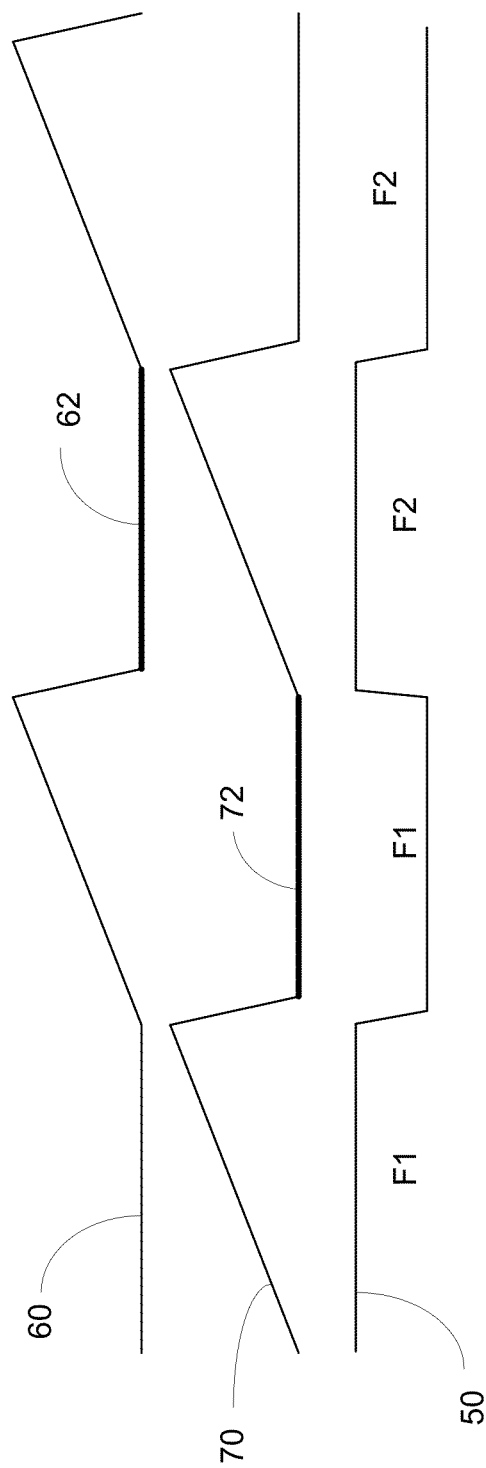
FIG. 4 is a waveform diagram of a frequency signal generated using a dual-slope oscillator according to an example embodiment of the present invention.

FIG. 4 shows an exemplary base frequency signal 50 generated by the oscillator 20 in response to a pair of input signals 60/70. The input signal 60 may correspond to the voltage that is generated at C1 in response to Code1 and the input signal 70 may correspond to the voltage that is generated at C2 in response to Code2. Each input signal 60/70 includes ramped pulses that generate corresponding pulses in the base frequency signal 50. For example, the input signal 60 may generate low clock semi-periods while the input signal 70 generates high clock semi-periods. According to example embodiments of the present invention, the frequency of the base frequency signal 50 is varied between at least two frequencies, e.g., some semi-periods have frequency F1 and other semi-periods have frequency F2. As explained below in connection with FIG. 5, the varying of the base frequency signal 50 enables the target frequency to be expressed with a higher resolution.

To vary the base frequency signal 50, the input signal 60 and the input signal 70 are changed by applying a new code word. Each of the input signals 60/70 may be changed while the other input signal is ramping. For example, during a time interval 72, the input signal 60 is ramping and producing a corresponding low clock semi-period (e.g., with a frequency F1) in the base frequency signal 50. At the same time, a new Code2 is applied in preparation for the generation of the next output semi-period. By the time the next output semi-period is to be generated (i.e., time interval 62), the effects of applying the new Code2 have settled and the input signal 70 is steadily producing the next ramp, resulting in a high clock semi-period having frequency F2. Similarly, Code1 may be changed during the time interval 72 to produce a low clock semi-period having frequency F2. In this manner, the frequency is switched from F1 to F2 instantaneously, so that the first F2 semi-period is available as soon as the last F1 semi-period is finished. The frequencies may be switched back and forth in accordance with the code sequence determined by the driver 10, thereby generating a base frequency signal having a specific frequency pattern (e.g., F1-F1-F2-F2 in FIG. 4).

Figure 5:
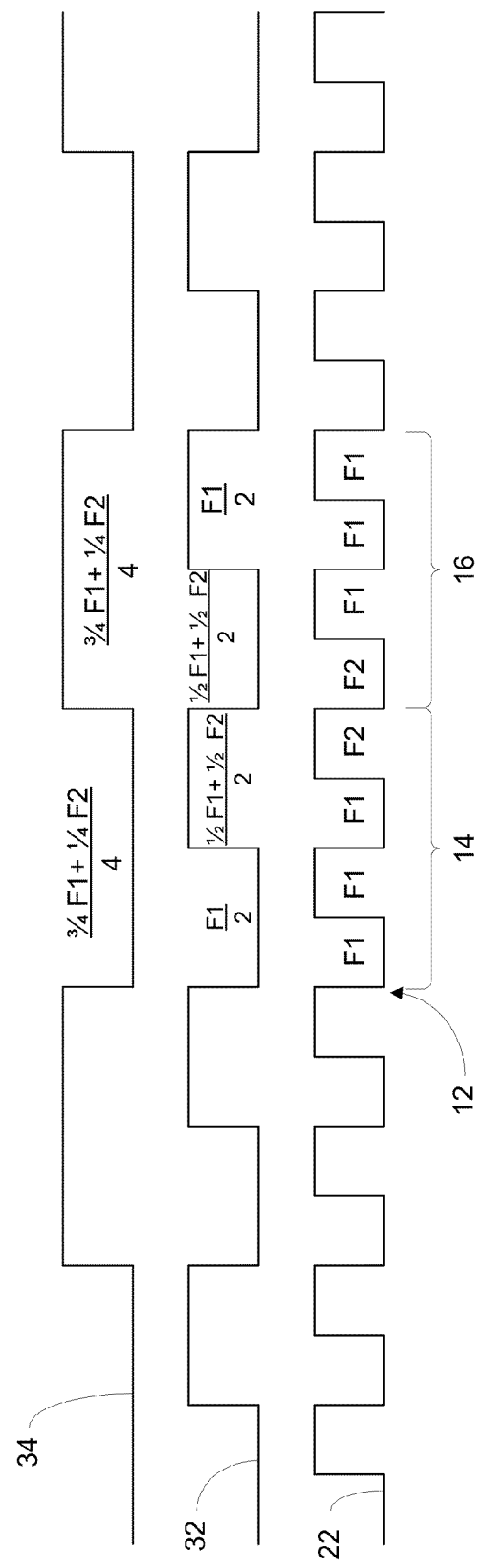
FIG. 5 is a waveform diagram showing the correspondence between a base frequency signal generated by an oscillator and a target frequency signal generated by using the base frequency signal according to an example embodiment of the present invention.

FIG. 5 shows a base frequency signal 22, an intermediate signal 32 and a target frequency signal 34 according to an exemplary embodiment of the present invention. The base frequency signal 22 may be generated in the same manner as the base frequency 50, e.g., by switching between frequencies F1 and F2. This corresponds to step 212 in FIG. 3, where the codes in the code sequence may be input as first and second inputs of the oscillator 20 (e.g., as Code1 and Code2). Based on the codes, the oscillator 20 generates the base frequency signal.

In step 214, the divider 30 may divide the base frequency signal to generate the target frequency signal. Depending on how the divider 30 is implemented, the target frequency signal may be generated in a single division operation or, alternatively, generated using a plurality of divisions that result in one or more intermediate frequency signals, such as the intermediate signal 32 in FIG. 5.

An example frequency pattern resulting from a code sequence is shown beginning at a time interval 12 and consists of two symmetric frequency patterns. A first frequency pattern 14 includes consecutive semi-periods having the frequencies F1-F1-F1-F2 and is immediately followed by a second frequency pattern 16 whose semi-periods include F2-F1-F1-F1. The intermediate signal 32 represents a division by a factor of two. Thus, two base frequency semi-periods may contribute to each intermediate signal semi-period. For example, the first two semi-periods in the pattern 14 (F1-F1)

may be divided to generate a low clock semi-period having frequency $$\frac{F1}{2}.$$

Similarly, the next two semi-periods in the pattern 14 (F1-F2) may be divided to generate a high clock semi-period having frequency which is approximately $$\frac{1/2*F1+1/2*F2}{2}.$$

This expression is only an approximation of the actual frequency because interpolation in this instance is non-linear. If the number of extra bits to be added (B) is big, then non-linear interpolation can affect the linearity of the code-to-frequency relationship. The nonlinearity is fixed compared to the N bits of the base oscillator, but as B increases, the non-linearity also increases.

The intermediate signal 32 is further divided to generate the target frequency signal 34, in this instance also by a factor of two. Thus, the low clock semi-period having frequency $$\frac{F1}{2}$$

and the high clock semi-period having a frequency of approximately $$\frac{1/2*F1+1/2*F2}{2}$$

both contribute to a low clock semi-period in the target frequency signal with a frequency of approximately $$\frac{3/4*F1+1/4*F2}{4}.$$

It has therefore been shown that by mixing different frequencies into the base frequency signal 22 (e.g., switching between F1 and F2), it is possible to generate target frequency signals with semi-periods that are a function of those different frequencies. Thus, additional frequencies can be expressed without increasing the number of bits (e.g., N bits) input into the oscillator.

FIG. 6 is a table showing frequency patterns corresponding to different combinations of bit values, made possible by the use of two additional bits of resolution (i.e., B=2). Each 2-bit combination may correspond to the two least significant bits of a digital representation of the target frequency, and may be expressed in terms of a corresponding frequency pattern. For example, 00 may correspond to F1-F1-F1-F1 and 11 may correspond to F1-F2-F2-F2. The most significant bits (e.g., N-bits) may correspond to F1, F2, or any other frequency capable of being expressed via the N-bit input to the oscillator 20.

In step 216, the driver 10 may determine whether the end of the code sequence has been reached. If the end of the sequence has not been reached, then the next set of codes in the sequence are selected in step 218 and applied as input to the oscillator 20. However, if the end of the sequence is reached, then the driver 10 may proceed to another code sequence or, if no new code sequence is available, the driver 10 may repeat the previous code sequence (step 220).

It will also be appreciated that the additional hardware expenditure associated with the driver 10 and the divider 30 may be negligible compared to the area increase required for additional input bits to a conventional oscillator. In many instances, hardware already exists that can readily be modified to produce the circuit 100. For example, an existing driver may be reprogrammed to operate in accordance with the driver 10, without adding any additional hardware.

In another aspect of the present invention, symmetric frequency patterns are included in each code sequence to minimize the number of frequency changes, and therefore reduce the error budget due to changing frequencies. For example, once a semi-period having the target frequency has been output, it may be desirable to generate a complementary semi-period having the same frequency. This is shown in FIG. 5, where the frequency pattern 16 (which is symmetric to the frequency pattern 14) is divided to produce a high clock semi-period in the target frequency signal with a frequency of approximately $$\frac{3/4*F1+1/4*F2}{4}.$$

It may further be desirable to maintain the target frequency, e.g., by repeating the code sequence (e.g., frequency pattern 14 followed by frequency pattern 16) until it is determined that high resolution is no longer required. In one embodiment, the driver 10 may include a state machine that selects between two code sequences corresponding to a high resolution mode of operation and a low resolution mode of operation. The state machine may alternate between the two modes depending on the operational requirements of the load being driven. For example, the high resolution mode may be used when the analog-to-digital converter being driven by the target frequency signal is initialized, after which operation may be switched to the low resolution mode, while periodically switching back to the high resolution mode.

Figure 7:
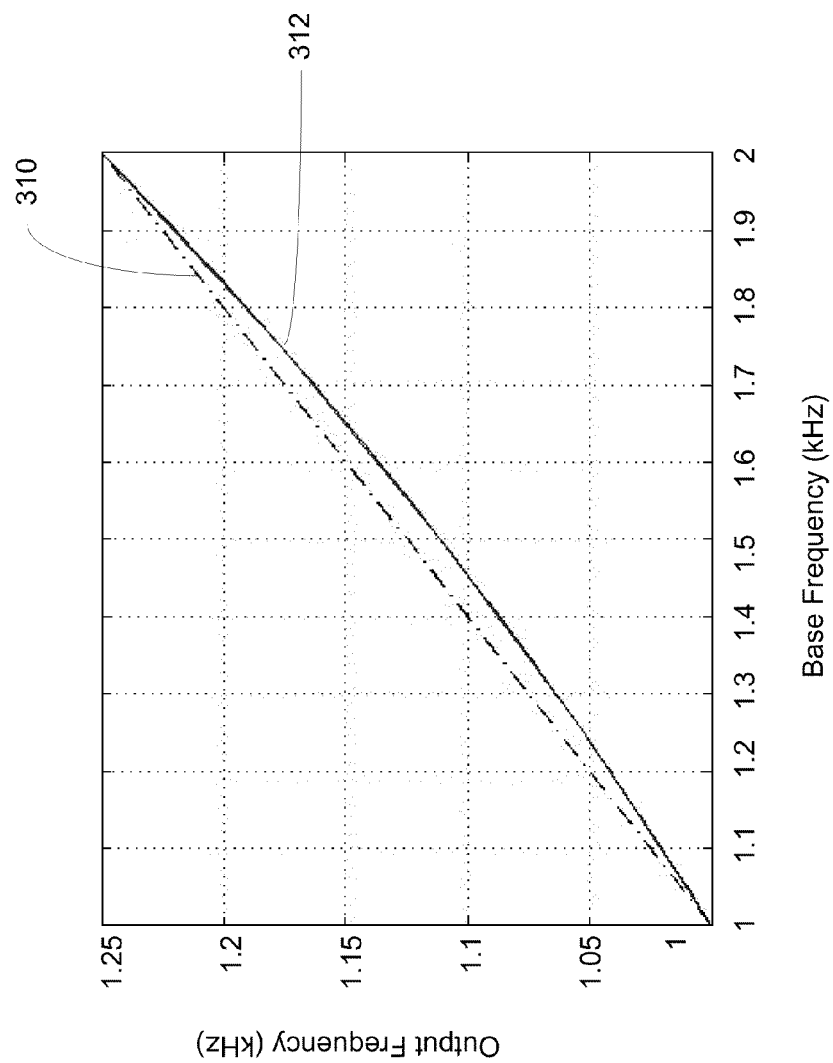
FIG. 7 is a graph showing the theoretical deviation in the target frequency output by a divider from frequencies that would be produced in an ideal interpolation.

FIG. 7 is a graph showing the theoretical deviation in the target frequency output by the divider 30 from frequencies that would be produced in an ideal interpolation. The extreme values (1 and 2) on the horizontal axis correspond to the base frequencies for Code1 and Code2. For example, Code1=1 kHz and Code2=2 kHz or, conversely, Code1=2 kHz and Code2=1 kHz. The frequencies in between the extreme values (e.g., 1.1, 1.2, 1.3 . . . ) correspond to new frequencies that are assigned by the interpolation and in this example, are separated by step sizes of 0.1 kHz. Thus, the horizontal axis represents a theoretical frequency (in this case a digital word or code that selects a frequency) that is normalized to a pair of base frequencies (1 and 2). The vertical axis corresponds to the actual value output by the divider 30 in response to input values equal to the values of the horizontal axis. An input frequency of 1 yields an output of 1 kHz, while an input of 2 yields 1.25 kHz. The dashed line 310 represents an ideal interpolation, while the non-linear curve 312 represents the actual output of the divider. It can be seen that the method and circuit of the present invention produce new target frequencies (selectable using the added bits of resolution) that closely approximate the ideal target frequencies.

In the preceding specification, the present invention has been described with reference to specific example embodiments thereof. It will, however, be evident that various modifications and changes may be made thereunto without departing from the broader spirit and scope of the present invention as set forth in the claims that follow. The embodiments described herein may be presented combined with each other in various combinations. The specification and drawings are accordingly to be regarded in an illustrative rather than restrictive sense.

What is claimed is:

1. A method for increasing a resolution of a digitally controlled oscillator, comprising:
   controlling the oscillator so that an output signal of the oscillator varies between semi-periods having a first frequency and semi-periods having a second frequency;
   applying the output signal of the oscillator as an input to a divider to obtain a divided signal, a frequency of at least one semi-period of the divided signal being a function of both an oscillator semi-period having the first frequency and an oscillator semi-period having the second frequency, wherein each semi-period of the divided signal is a function of a plurality of oscillator semi-periods; and
   controlling the oscillator based on a target frequency for the divider so that each semi-period of the divided signal has the target frequency, by:
      for any particular target frequency, setting the number of oscillator semi-periods having the first frequency to be the same for each semi-period of the divided signal; and
      for any particular target frequency, setting the number of oscillator semi-periods having the second frequency to be the same for each semi-period of the divided signal.

2. The method of claim 1, wherein each semi-period of the divided signal is a function of a high semi-period and a low semi-period, the high semi-period being adjacent to the low semi-period in the output signal of the oscillator.

3. The method of claim 1, wherein high semi-periods are generated by a first digital input and low semi-periods are generated by a second digital input that is non-overlapping in time with the first digital input.

4. The method of claim 3, further comprising:
   applying the first digital input while the low semi-periods are being output; and
   applying the second digital input while the high semi-periods are being output.

5. The method of claim 3, further comprising:
   controlling the oscillator so that a first pattern of semi-periods are output, followed by a second pattern of semi-periods, the frequencies in the second pattern varying in reverse order to the frequencies in the first pattern, so that the first pattern and the second pattern are symmetric.

6. The method of claim 3, wherein the digital inputs are generated by a digital driver that outputs each digital input as an N-bit code word.

7. The method of claim 6, wherein the digital driver sequentially generates the first digital input and the second digital input based on a target frequency having N+B bits of resolution.

8. The method of claim 1, further comprising:
   setting the divider to divide the output signal by a factor of 2B, where B represents a number of bits by which the resolution of the oscillator is increased.

9. The method of claim 1, further comprising:
   setting the divider to perform at least one additional division after performing an initial division of the output signal, each at least one additional division providing a one-bit increase in resolution.

10. The method of claim 1, further comprising:
    controlling the oscillator so that the output signal is two times faster than a target frequency for each additional bit of increased resolution.

11. A circuit for increasing a resolution of a digitally controlled oscillator, comprising:
    a driver that controls the oscillator so that an output signal of the oscillator varies between semi-periods having a first frequency and semi-periods having a second frequency; and
    a divider into which the output signal of the oscillator is input to obtain a divided signal, a frequency of at least one semi-period of the divided signal being a function of both an oscillator semi-period having the first frequency and an oscillator semi-period having the second frequency;
    wherein:
       each semi-period of the divided signal is a function of a plurality of oscillator semi-periods; and
       the driver controls the oscillator based on a target frequency for the divider so that each semi-period of the divided signal has the target frequency, by:
          for any particular target frequency, setting the number of oscillator semi-periods having the first frequency to be the same for each semi-period of the divided signal; and
          for any particular target frequency, setting the number of oscillator semi-periods having the second frequency to be the same for each semi-period of the divided signal.

12. The circuit of claim 11, wherein each semi-period of the divided signal is a function of a high semi-period and a low semi-period, the high semi-period being adjacent to the low semi-period in the output signal of the oscillator.

13. The circuit of claim 11, wherein high semi-periods are generated by a first digital input and low semi-periods are generated by a second digital input that is non-overlapping in time with the first digital input.

14. The circuit of claim 13, wherein the driver:
    applies the first digital input while the low semi-periods are being output; and
    applies the second digital input while the high semi-periods are being output.

15. The circuit of claim 13, wherein the driver:
    controls the oscillator so that a first pattern of semi-periods are output, followed by a second pattern of semi-periods, the frequencies in the second pattern varying in reverse order to the frequencies in the first pattern, so that the first pattern and the second pattern are symmetric.

16. The circuit of claim 13, wherein the driver outputs each digital input as an N-bit code word.

17. The circuit of claim 16, wherein the driver sequentially generates the first digital input and the second digital input based on a target frequency having N+B bits of resolution.

18. The circuit of claim 11, wherein the divider divides the output signal by a factor of 2B, where B represents a number of bits by which the resolution of the oscillator is increased.

19. The circuit of claim 11, wherein the divider performs at least one additional division after performing an initial division of the output signal, each at least one additional division providing a one-bit increase in resolution.

20. The circuit of claim 11, wherein the driver controls the oscillator so that the output signal is two times faster than a target frequency for each additional bit of increased resolution.

21. The circuit of claim 11, wherein the driver controls the oscillator based on the target frequency so that each period of the divided signal has the target frequency, by:
for each period of the divided signal, setting the oscillator to repeat the same number of oscillator semi-periods having the first frequency and repeat the same number of oscillator semi-periods having the second frequency.

22. The method of claim 1, further comprising:
controlling the oscillator based on the target frequency so that each period of the divided signal has the target frequency, by:
for each period of the divided signal, setting the oscillator to repeat the same number of oscillator semi-periods having the first frequency and repeat the same number of oscillator semi-periods having the second frequency.

* * * * *